(12) United States Patent  
Lambert et al.

(10) Patent No.: US 7,483,313 B2
(45) Date of Patent: Jan. 27, 2009

(54) DUAL PORTED MEMORY WITH SELECTIVE READ AND WRITE PROTECTION

(75) Inventors: Timothy M. Lambert, Austin, TX (US); Shawn J. Dube, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 11/669,792

(22) Filed: Jan. 31, 2007

(65) Prior Publication Data

US 2008/0183974 A1 Jul. 31, 2008

(51) Int. Cl.
*G11C 7/00* (2006.01)

(52) U.S. Cl. .............................. 365/189.04; 365/230.05

(58) Field of Classification Search ............. 365/230.05
See application file for complete search history.

(56) References Cited

U.S. PATENT DOCUMENTS

| | | | | |
|---|---|---|---|---|
| 4,796,232 A | * | 1/1989 | House ................... 365/189.03 |
| 5,014,247 A | * | 5/1991 | Albachten, III et al. 365/230.05 |
| 5,047,982 A | | 9/1991 | Smith et al. |
| 5,097,445 A | * | 3/1992 | Yamauchi ................... 365/195 |
| 5,134,589 A | * | 7/1992 | Hamano ................... 365/238.5 |
| 5,459,851 A | * | 10/1995 | Nakajima et al. ........... 711/149 |
| 5,469,557 A | | 11/1995 | Salt et al. |
| 5,812,446 A | | 9/1998 | Tailliet |
| 5,901,328 A | * | 5/1999 | Ooe .............................. 710/5 |
| 6,034,889 A | | 3/2000 | Mani et al. |
| 6,317,367 B1 | * | 11/2001 | Sample et al. ......... 365/189.098 |
| 6,625,699 B2 | * | 9/2003 | Cohen et al. ................. 711/150 |
| 6,738,286 B2 | | 5/2004 | La Rosa |
| 6,738,308 B2 | | 5/2004 | Charlier et al. |
| 6,914,846 B2 | | 7/2005 | Harari et al. |
| 7,007,145 B2 | | 2/2006 | Schrödinger et al. |
| 2005/0226023 A1 | | 10/2005 | Wallace et al. |
| 2006/0112246 A1 | | 5/2006 | Boning |

OTHER PUBLICATIONS

"24LC41A 1K/4K 2.5V Dual mode, Dual Prt I2C™ Serial EEPROM," Microchip Technology, Inc., 2003, DS21176D.

* cited by examiner

*Primary Examiner*—Son L Mai
(74) *Attorney, Agent, or Firm*—Larson Newman Abel & Polansky, LLP

(57) ABSTRACT

A device comprising a first port, a second port, and a non-volatile memory. The first port is coupled to and accessible by a first module, and the second port is coupled to and accessible by a second module. The non-volatile memory of the device comprises a first memory portion and a second memory portion. The first memory portion is writable by the first port and write protected from the second port, and the second memory portion is writable by the second port and write protected from the first port.

16 Claims, 5 Drawing Sheets

DUAL PORTED MEMORY WITH SELECTIVE READ AND WRITE PROTECTION

FIELD OF THE DISCLOSURE

This disclosure relates generally to a memory storage device, and relates more particularly to multiport memory storage devices.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A multiport memory device can provide storage for multiple modules located within a system or can provide storage for multiple systems. The modules in the system, or the multiple systems can be isolated from one another, so that data stored by a module or system is only available to another module or system at the multiport memory device. Data from the different modules or systems are saved in one memory portion of the multiport memory device. Management of the memory is desirable, so that the data stored by each module or system is maintained, and is not corrupted by data stored by other modules Accordingly, there is a need for an improved memory device.

BRIEF DESCRIPTION OF THE DRAWINGS

It will be appreciated that for simplicity and clarity of illustration, elements illustrated in the Figures have not necessarily been drawn to scale For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Disclosed is a multiport memory device, wherein there are multiple memory portions to allow modules within a system to store data on the multiport memory device. Each memory portion has a selective read and write permission for accessing the data by a module within the system. The read and write permission is based on a determination of which particular memory portion to be accessed and which module is making the read or write request. With different modules having write permission on the memory portions the data in the memory portions are protected from being corrupted by a module that does not have access to write data. Also with different modules having different read permission the memory portions allow for secure protection of the stored data. For example, the read and write permissions can be set so that only authorized modules can read or write secured data saved in the memory portions.

Figure 1:
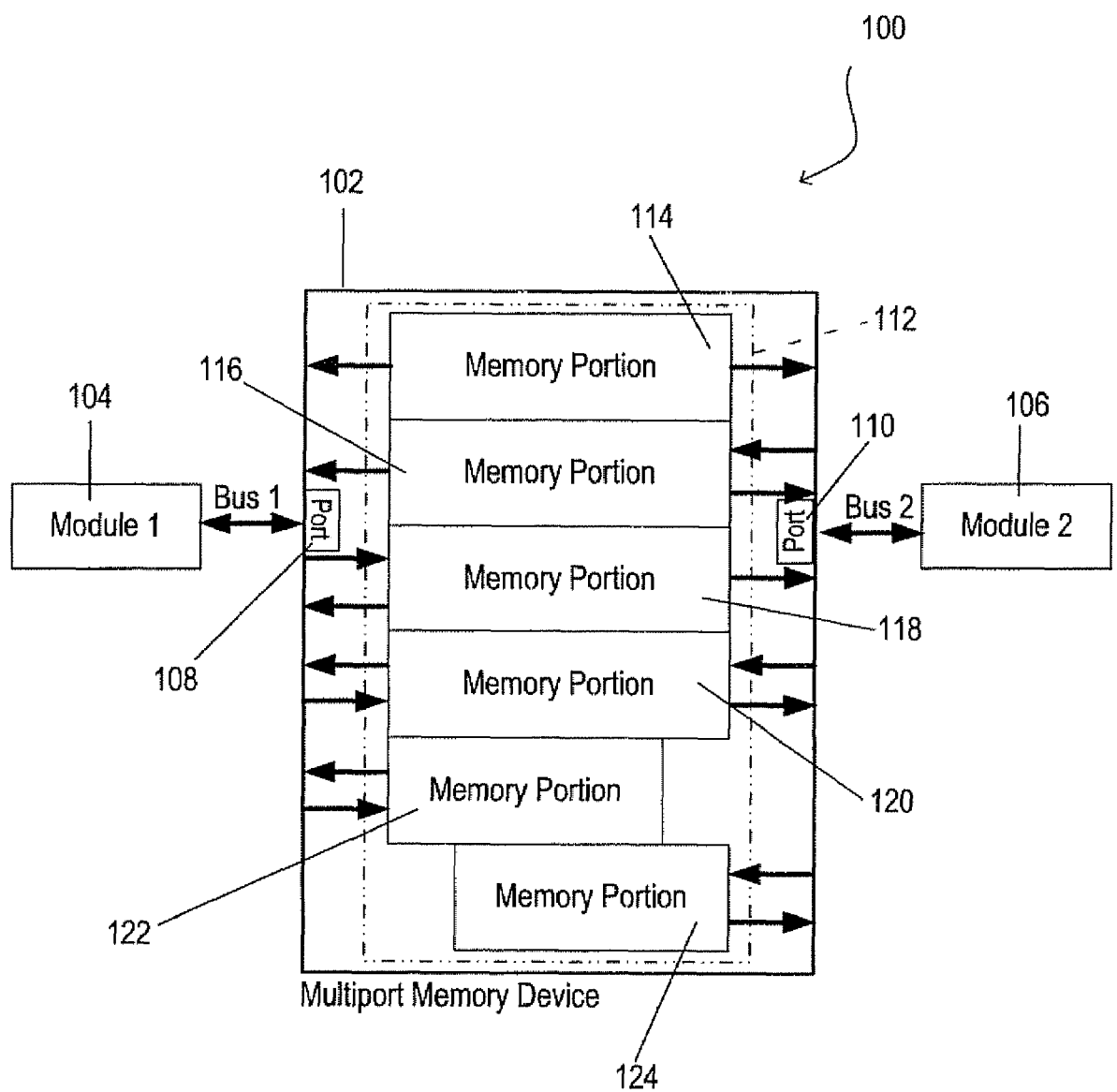
FIG. 1 is an exemplary block diagram of a multiport non-volatile memory device.

FIG. 1 shows an exemplary block diagram of a particular embodiment of a system 100. The system 100 includes a multiport memory device 102 coupled to a first module 104 and a second module 106. The first module 104 is coupled to a first port 108 of the multiport memory device 102 and the second module 106 is coupled to a second port 110. As illustrated, the first module 104 and the second module 106 are on two separate buses within the system 100, so they do not have any direct communication with each other. The first port 108 allows communication and data transfer between the multiport memory device 102 and the first module 104, and the second port 110 allows communication and data transfer between the multiport memory device 102 and the second module 106. It will be appreciated that although the first module 104 and the second module 106 are illustrated as different modules of a system, in another particular embodiment the first module and the second module are separate independent systems that access the multiport memory device 102.

The multiport memory device 102 includes a memory bank 112 to store the data from the first module 104 and the second module 106. The memory bank 112 includes a first memory portion 114, a second memory portion 116, a third memory portion 118, a fourth memory portion 120, a fifth memory portion 122, and a sixth memory portion 124.

During operation of the system 100, the various portions of the memory bank 112 have selective read and write permissions for both the first module 104 and the second module 106. In the illustrated embodiment, the first memory portion 114 is read only memory where neither the first module 104 nor the second module 106 has write permission for the first memory portion In contrast, the second memory portion 116 allows read request from both the first module 104 and the second module 106, but only allows write requests from the second module. Additionally, the third memory portion 118 allows read request from both the first module 104 and the second module 106, and only allows write requests from the first module. Next, the fourth memory portion 120 allows both read and write requests from both the first module 104 and the second module 106. Also, the fifth memory 122 allows both read and write requests from the first module 104, but is not visible by the second module 106. Finally, the sixth memory 124 allows both read and write requests from the second module 106, but is not read or writable by the first module 104. The first memory portion 114, the second memory portion 116, the third memory portion 118, the fourth memory portion 120, the fifth memory portion 122, and the sixth memory portion 124 are selectively mapped to the first port 108 and the second port 110 to allow the different read and write request from the first module 104 and the second module 106.

This example of read and write permissions on the different memory portions allows the data saved on the multiport memory device 102 to be protected from corruption. The fifth memory portion 122 and the sixth memory portion 124 allow security to the first module 104 and the second module 106, because only one module has read and write permission on the fifth memory portion and the sixth memory portion. With only one module having access to a memory portion, the module is able to store data securely on the multiport memory device 102. The other read and write permissions allow one of the modules or neither module to write data on the memory portion associated with the particular permission, but both modules can read the data on the memory portion. These read and write permissions allow only certain data to be changed by either the first module 104 or the second module 106 so that the data is not corrupted by the other module that is not allowed to store data on the memory portion.

The selective read and write permissions stated above are set in a variety of ways One such way is by a controller (not shown) of the multiport memory device 102, which assigns the specific read and write permissions and thereby controls the access to each of the memory portions. When a read or write request is made the controller determines which module is sending the request and which memory portion the request is directed toward and based on this information the controller either allows or denies the request. In another particular embodiment, either the first module 104 or the second module 106 stores the selective read and write permissions for each memory portion when the system is first setup.

Additionally, in a different setup the first port 108 and the second port 110 allow the different read and write request from the first module 104 and the second module 106 for the first memory portion 114, the second memory portion 116, the third memory portion 118, the fourth memory portion 120, the fifth memory portion 122, and the sixth memory portion 124. In another particular embodiment the first module 104 and the second module 106 each store a map set that indicates the read or write permissions for each memory portion. Also, in another embodiment the read and write permission is controlled by a control module (not shown) within the multiport memory device 102. The control module determines the appropriate permission and the size of each memory portion based on stored control information. The control information can be provided by firmware of the multiport memory device 102 and the read and write permissions can be changed by a firmware upgrade, this allows on-the-fly permission changing. Further, the stored control information can be changed by either of the modules 104 and 106. In a particular embodiment, the modules 104 and 106 must supply a software key in order to gain authorization to change the control information.

The multiport memory device 102 uses internal FLASH to create the memory bank 112 into a virtual dual port non-volatile memory bank. Non-volatile memory is capable of retaining data even when there is no longer any power supplied to the non-volatile memory. Thus, information from the first module 104 and the second module 106 saved on the memory bank 112 can be accessed every time the multiport memory device 102 is turned on.

When accessing the memory bank 112 to read data the first module 104 uses the first port 108 and the second module 106 uses the second port 10 of the multiport memory device 102. With in-system based firmware updates, the memory bank 112 and data allocations for the first memory portion 114, the second memory portion 116, the third memory portion 118, the fourth memory portion 120, the fifth memory portion 122 and the sixth memory portion 124 can be restructured, as well as the associated permissions for the first module 104 and the second module 106.

Figure 2:
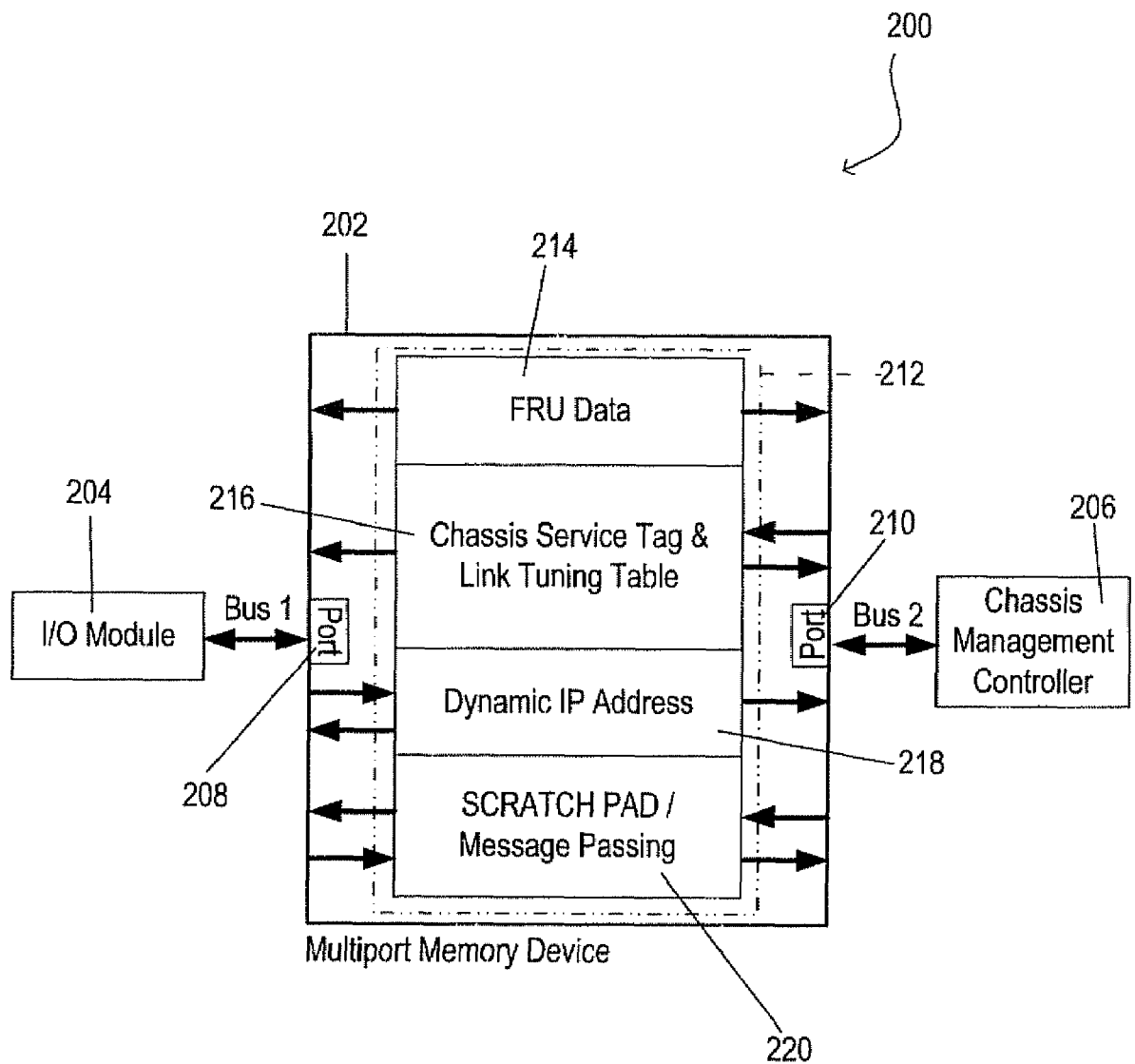
FIG. 2 is an exemplary block diagram of a multiport non-volatile memory device within a modular server chassis.

FIG. 2 shows an exemplary block diagram of a particular embodiment of a system 200. The system 200 includes a multiport memory device 202 coupled to an input and output (I/O) module 204 and a chassis management controller (CMC) 206 by a first port 208 and a second port 210. In the illustrated embodiment the system 200 is a server chassis system, or any similar system. The first port 208 allows communication and data transfer between the multiport memory device 202 and the I/O module 204, and the second port 210 allows communication and data transfer between the multiport memory device 202 and the CMC 206. The multiport memory device 202 uses a memory bank 212 to store the data from the I/O module 204 and the CMC 206. The memory bank 212 includes a first memory portion 214, a second memory portion 216, a third memory portion 218 and a fourth memory portion 220.

When accessing the memory bank 212 to read data the I/O module 204 uses the first port 208 and the CMC 206 uses the second port 210 of the multiport memory device 202. The first memory portion 214 is factory-written onto the multiport memory device 202 with field replaceable unit (FRU) data for the multiport memory device. The second memory portion 216 has chassis service tag and link-tuning table data stored on it where the CMC 206 writes the data for the I/O module 204 to access. Also, the third memory portion 218 has dynamic IP address data stored on it by an I/O module 204 for a chassis management module to read. The I/O module 204 and the CMC 206 each save data in the fourth memory portion 220 that both the I/O module 204 and the CMC 206 manipulate and rewrite in the multiport memory device 202 In system 200, the fourth memory portion 220 is like a scratch pad and used for message posting by both the I/O module 204 and the CMC 206 to save data such as BAUD rates for the system.

Figure 3:
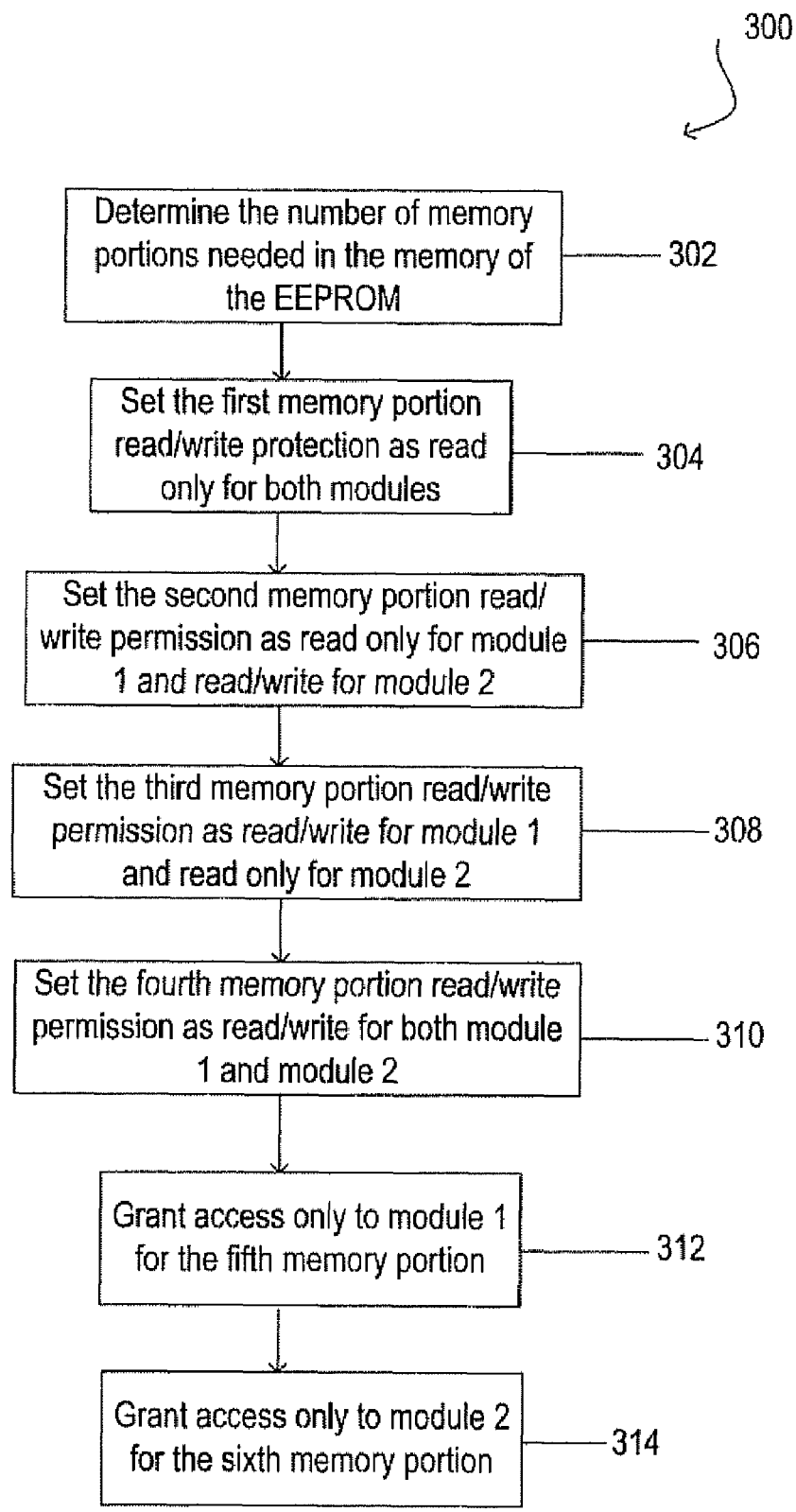
FIG. 3 is a flow chart of implementing a multiport non-volatile memory device.

FIG. 3 shows a flow chart 300 of an exemplary method of using a virtual dual port non-volatile multiport memory device in a computer device or subsystem In step 302, the number of memory portions needed for a multiport memory device is determined Security needs for the modules coupled to the multiport memory device and the types of data to be stored are used in determining the number of memory portions needed in the multiport memory device. For example, one or both of the modules may have critical information that is desirable to protect from access by the other module. In that case, each module can be assigned its own separate memory portion in the multiport memory device with other modules being denied read or write access to the memory portion. Further, it may be desirable to allow information stored by one module to be readable by the other module.

In step 304 the read/write permission for the first memory portion is set to read-only for both modules. Next, in step 306 the read/write permission for the second memory portion is set to read-only for the first module and full read/write permission for the second module. In step 308 the read/write permission for the third memory portion is set to read-only for the second module and full read/write permission for the first module. In step 310 the read/write permission for the fourth memory portion is set to full read/write permission for both the first module and the second module. In the next step 312, full read/write permission of the fifth memory portion is granted for the first module and no read/write permission is granted to the second module, which makes the fifth memory portion invisible to the second module. Finally, in the next step 314 full read/write permission of the sixth memory portion is granted to the second module and no read/write permission is granted to the first module, which makes the sixth memory portion invisible to the first module.

Figure 4:
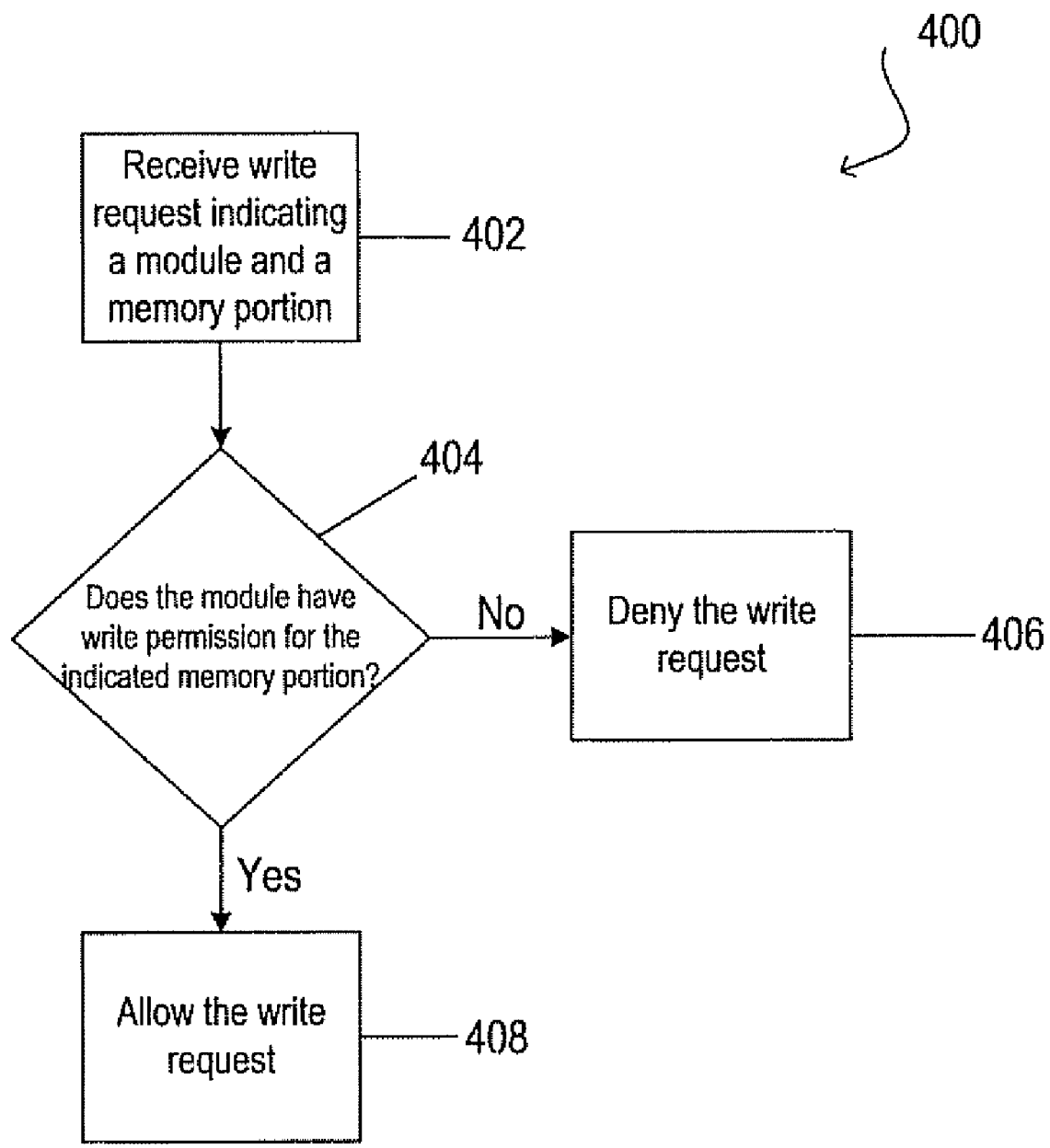
FIG. 4 is a flow diagram of allowing or denying a write request in a non-volatile multiport memory device.

FIG. 4 shows an exemplary flow diagram 400 of using selective write permission in the system 100. In step 402 the multiport memory device receives a write request, which indicates a module and a memory portion. The write request indicates whether the first module or the second module sent the write request, and the memory portion the module wants to access. The method proceeds, in step 404 the determination of whether the module requesting the write permission has access to the indicated memory portion. As indicated in step 406, if the module does not have write permission for the memory portion indicated in the write request, the request will be denied and the multiport memory device will wait for another write request. However, if as shown in step 408 the module does have write permission for the memory portion indicated, the write request will be allowed.

Figure 5:
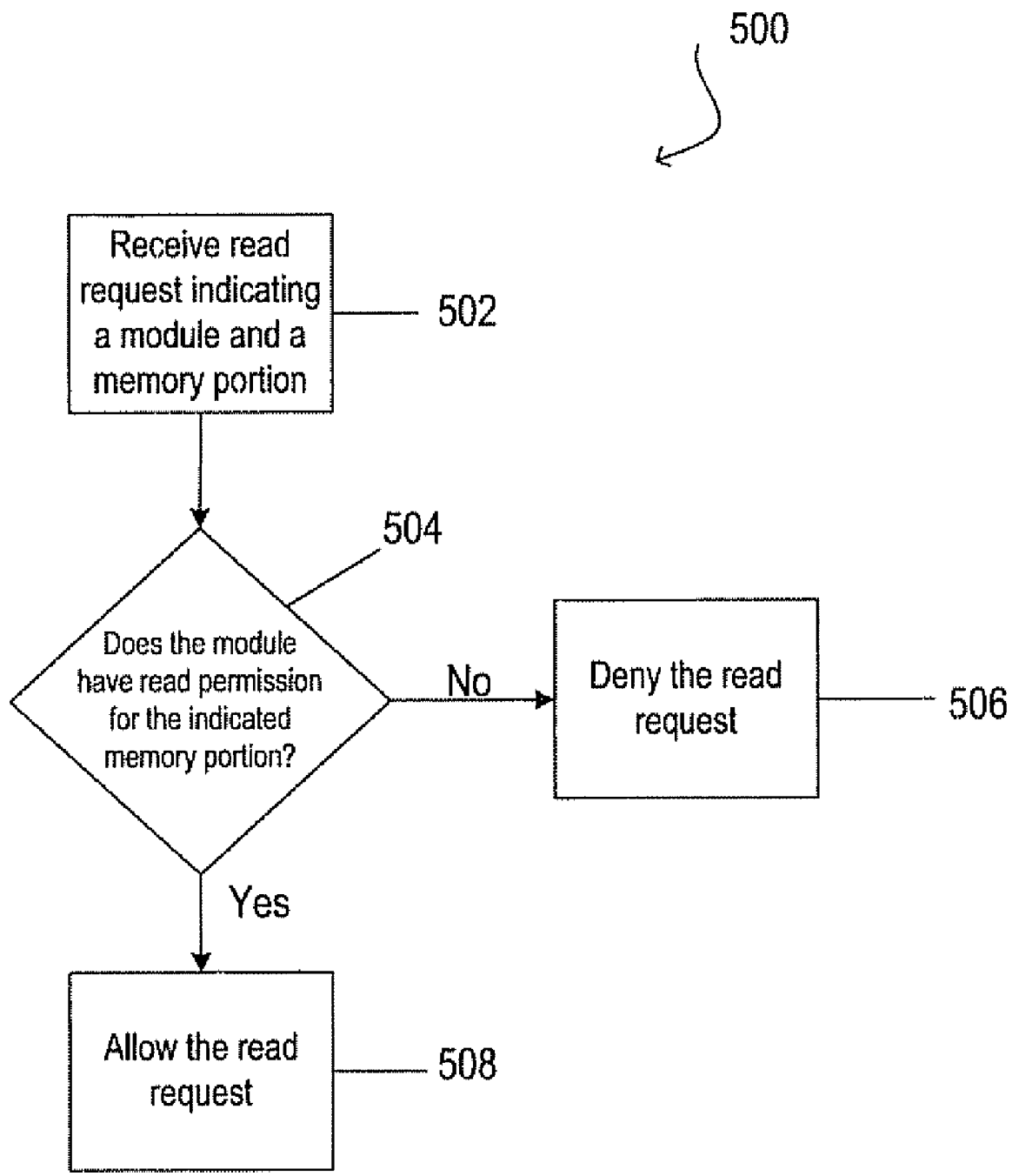
FIG. 5 is a flow diagram of allowing or denying a read request in a non-volatile multiport memory device.

FIG. 5 shows an exemplary flow diagram 500 of using selective write permission in the system 100. In step 502, the multiport memory device receives a write request, which indicates a module and a memory portion. The write request indicates whether the first module or the second module sent the write request, and the memory portion the module wants to access. Step 504 indicates that the determination of whether the module requesting the write permission has access to the indicate memory portion is performed. In step 506, if the module does not have write permission for the memory portion indicated in the write request, the request will be denied and the multiport memory device will wait for another write request. However, if as shown in step 508 the module does have write permission for the memory portion indicated, the write request will be allowed.

It will be appreciated that although only two ports have been discussed more than the illustrated number of ports, memory portions, and permission can be employed.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims In the claims, means-plus-function clauses are intended to cover the structures described herein as performing the recited function and not only structural equivalents, but also equivalent structures.

What is claimed is:

1. A device comprising:
   a first port coupled to and accessible by a first module;
   a second port coupled to and accessible by a second module; and
   a non-volatile memory comprising: a first memory portion writable by the first port and write protected from the second port, a second memory portion writable by the second port and write protected from the first port, and a third memory portion writable by both the first port and the second port.

2. The device of claim 1 further comprising:
   a fourth memory portion write protected from both the first port and the second port.

3. The device of claim 2 further comprising:
   a fifth memory portion writable by the first port and read protected and write protected from the second port.

4. The device of claim 3 further comprising:
   a sixth memory portion writable by the second port and read protection and write protected from the first port.

5. The device of claim 4 wherein the write protection of the first memory portion, the second memory portion, the third memory portion, the fourth memory portion, the fifth memory portion and the sixth memory portion is selectively based on the memory portion and the port requesting the write.

6. The device of claim 1 further comprising:
   a first bus coupled to the first port; and
   a second bus coupled to the second port.

7. The device of claim 6 wherein the first module is coupled to the first bus.

8. The device of claim 6 wherein the second module is coupled to the second bus.

9. A method comprising:
   receiving a first write request indicating a first module and a first memory portion;
   determining a first access permission based on the first write request;
   allowing the first access permission for the first write request indicating the first module and the first memory portion;
   receiving a second write request indicating a second module and the first memory portion;
   determining a second access permission based on the second write request; and
   denying the second access permission for the second write request indicating the second module and the first memory portion.

10. The method of claim 9 further comprising:
    receiving a third write request indicating the first module and the second memory portion;
    determining a third access permission based on the third write request;
    denying the third access permission for the third write request indicating the first module and the second memory portion;
    receiving a fourth write request indicating the second module and the second memory portion;
    determining a fourth access permission based on the fourth write request; and
    allowing the fourth access permission for the fourth write request indicating the second module and the second memory portion.

11. The method of claim 10 wherein the first module is connected to a first port and the second module is connected to a second port.

12. The method of claim 11 wherein the accessibility of the first memory portion and the second memory portion by the first module is through the first port.

13. The method of claim 11 wherein the accessibility of the first memory portion and the second memory portion by the second module is through the second port.

14. The method of claim 10 wherein the first module is isolated from the second module.

15. A system comprising:

a first module;

a second module; and a memory device comprising: a first memory portion having a first read permission and a first write permission for the first module and a second read permission and a second write permission for the second module, a second memory portion having a third read permission and a third write permission for the first module and a fourth read permission and a fourth write permission for the second module, a third memory portion having a fifth read permission and a fifth write permission for the first module and a sixth read permission and a sixth write permission for the second module, a first port coupled to the first module and a second port coupled to the second module, wherein the first memory portion selectively allows a write request from the first module through the first port and denies the write request from the second module through the second port, wherein the second memory portion selectively allows the write request from the second module through the second port and denies the write request from the first module through the first port.

16. The system of claim 15 wherein the memory device resets the first read permission, the first write permission, the second read permission, the second write permission, the third read permission, the third write permission, the fourth read permission and the fourth write permission; allowing different read permissions and write permissions based on the first module, the second module, the first memory portion, and the second memory portion.

* * * * *